United States Patent
Yang et al.

(10) Patent No.: US 9,142,446 B2
(45) Date of Patent: Sep. 22, 2015

(54) SEMICONDUCTOR DEVICES AND FABRICATION METHODS THEREOF

(71) Applicant: Semiconductor Manufacturing International (Shanghai) Corporation, Shanghai (CN)

(72) Inventors: Guangli Yang, Shanghai (CN); Qianrong Yu, Shanghai (CN); Ming Wang, Shanghai (CN); Xianyong Pu, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/182,789

(22) Filed: Feb. 18, 2014

(65) Prior Publication Data

US 2015/0076555 A1    Mar. 19, 2015

(30) Foreign Application Priority Data

Sep. 18, 2013    (CN) .......................... 2013 1 0429750

(51) Int. Cl.
| | | |
|---|---|---|
| H01L 21/762 | (2006.01) | |
| H01L 29/739 | (2006.01) | |
| H01L 29/66 | (2006.01) | |
| H01L 29/78 | (2006.01) | |

(52) U.S. Cl.
CPC .... *H01L 21/76229* (2013.01); *H01L 29/66325* (2013.01); *H01L 29/66681* (2013.01); *H01L 29/7393* (2013.01); *H01L 29/7816* (2013.01)

(58) Field of Classification Search
None
See application file for complete search history.

(56) References Cited

U.S. PATENT DOCUMENTS

2014/0008725 A1\*    1/2014    Chen ............................ 257/343

\* cited by examiner

*Primary Examiner* — Whitney T Moore
(74) *Attorney, Agent, or Firm* — Anova Law Group, PLLC (57) ABSTRACT

A semiconductor device is provided. The semiconductor device includes a semiconductor substrate; and a body region and a drift region formed in the semiconductor substrate. The semiconductor device also includes a bulk region and a source region formed in the body region. Further, the semiconductor device includes a drain region and a first shallow trench isolation structure having a ladder-like bottom formed in the drift region. Further, the semiconductor device also includes a gate structure spanning over an edge of the body region and an edge of the drift region formed on the semiconductor substrate and covering a portion of the first shallow trench isolation structure.

20 Claims, 4 Drawing Sheets

SEMICONDUCTOR DEVICES AND FABRICATION METHODS THEREOF

CROSS-REFERENCES TO RELATED APPLICATIONS

This application claims the priority of Chinese patent application No. 201310429750.6, filed on Sep. 18, 2013, the entirety of which is incorporated herein by reference.

FIELD OF THE INVENTION

The present invention generally relates to the field of semiconductor manufacturing technology and, more particularly, relates to semiconductor devices and fabrication techniques thereof.

BACKGROUND

Currently, lateral double diffused MOSFETs (LDMOS-FETs) and lateral insulated gate bipolar transistors (LIGBTs) are widely used in the circuits of logic power managers, electrical chargers, DC-DC converters or AC-DC convertors, etc. With the continuous shrinkage of the critical dimension of CMOS processes, in order to improve the efficiency and reduce the chip size of the LDMOSFETS and the LIGBTs, the on-resistance ($R_{on}$) of the LDMOSFETs and the LIGBTs should be as small as possible.

Further, with the continuous shrinkage of the critical dimension of the CMOS processes, the ability of the transistors for sustaining a high voltage and a high current continuously decreases. Deep sub-micron CMOS integration circuits (ICs) are more volatile to electrostatic charge (ESD); and easier to fail, thus the reliability of IC products may be reduced. In order to prevent the failure of the IC products caused by the ESD, ESD protection devices having a significantly good performance and an ability to sustain high voltage are used in the CMOS ICs. Currently, the ESD protection devices may include diodes, gate grounded NMOS transistors (GGNMOSFET), silicon controlled rectifiers (SCRs), LDMOSFETs, and LIGBTs, etc. In order to increase the safety of IC circuits, devices including LDMOSFETs and the LIGBTs, etc., may need to have a significantly large breakdown voltage.

For the LDMOSFETs and the LIGBTs, an on-resistance and a breakdown voltage are two important electrical parameters. The on-resistance is reversely proportional to a doping concentration of the drifting region; and the breakdown voltage is proportional to the doping concentration of the drifting region. That is, a higher doping concentration of the drifting region may aid to reduce the on-resistance of a LDMOSFET or a LIGBT and to increase an on-current of the LDMOSFET or the LIGBT, but it may reduce the breakdown voltage of the LDMOSFET or the LIGBT, which may affect the safety of the circuit. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a semiconductor substrate; and forming a plurality of trenches with different depths in the semiconductor substrate. The method also includes forming a first oxide layer by oxidizing the semiconductor substrate between trenches; and forming a first shallow trench isolation structure by filling the trenches with different depth with dielectric material. Further, the method includes forming a body region and a drift region in the semiconductor substrate, wherein the first shallow trench isolation structure is in the drift region; and forming a bulk region and a source region in the body region and a drain region in the drift region at one side of the first shallow trench isolation structure away from the body region. Further, the method also includes forming a gate structure spanning over an edge of the body region and an edge of the drift region and covering a portion of the first shallow trench isolation structure on the semiconductor substrate.

Another aspect of the present disclosure includes a semiconductor device. The semiconductor device includes a semiconductor substrate; and a body region and a drift region formed in the semiconductor substrate. The semiconductor device also includes a bulk region and a source region formed in the body region. Further, the semiconductor device includes a drain region and a first shallow trench isolation structure having a ladder-like bottom formed in the drift region. Further, the semiconductor device also includes a gate structure spanning over an edge of the body region and an edge of the drift region formed on the semiconductor substrate and covering a portion of the shallow trench isolation structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In a lateral double diffused MOSFET (LDMOSFET) or a lateral insulated gate bipolar transistor (LIGBT); although a higher doping concentration in the drifting region may aid to increase the on-current of the LDMOSFET or the LIGBT, it may reduce the breakdown voltage of the LDMOSFET or the LIGBT. Further, when the doping concentration of the drifting region is relatively small, a surface electric field of a drain junction of the LDMOSFET or the LIGBT may be relatively high, a breakdown may firstly occur at a contact position of a drain region and the drifting region of the LDMOSFET or the LIGBT. When the doping concentration of the drifting region is relatively high, a breakdown may be easy to happen between the drifting region and a substrate region near to a bulk region of the LDMOSFET or the LIGBT. The disclosed embodiments overcome such problems by forming a ladder-like shallow trench isolation (STI) structure in the drifting region.

Figure 6:
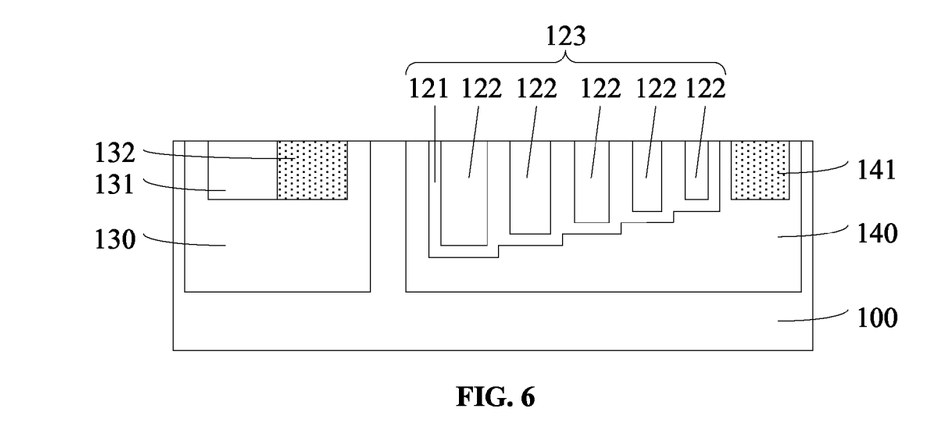
Figure 7:
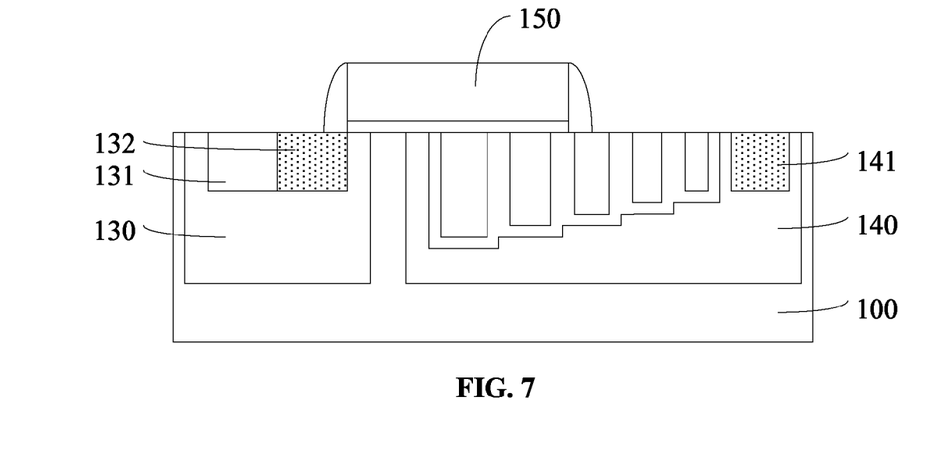
Figure 8:
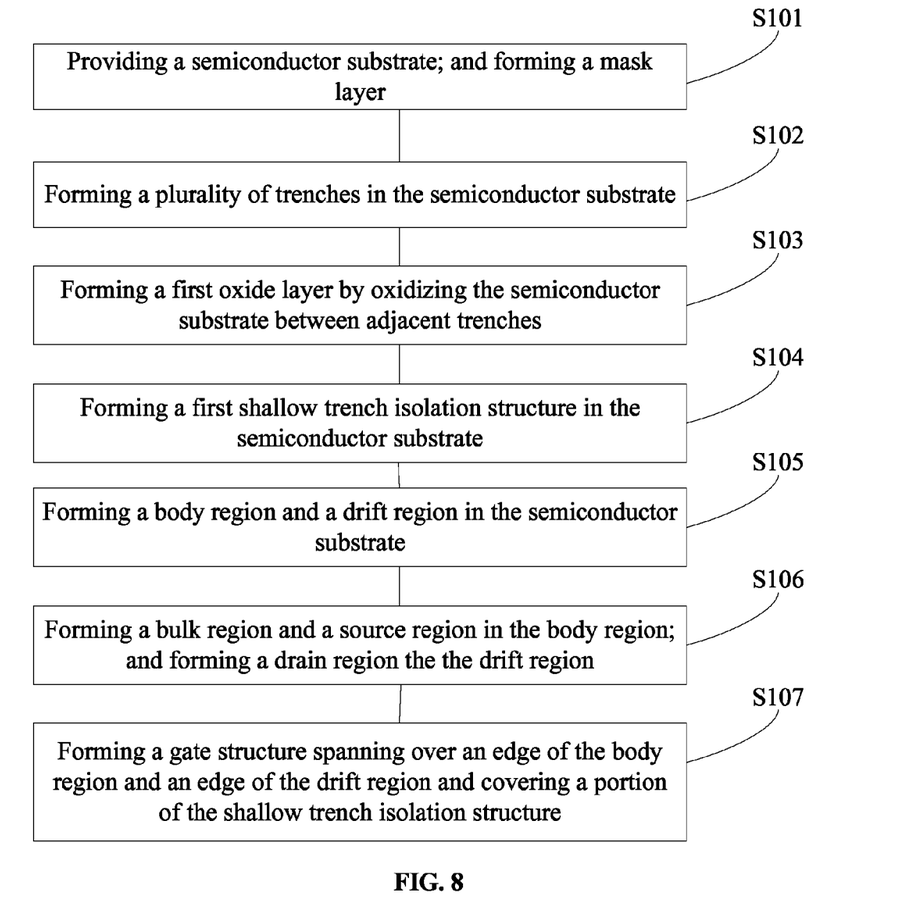
FIG. 8 illustrates an exemplary fabrication process of a semiconductor device consistent with the disclosed embodiments.

FIG. 8 illustrates an exemplary fabrication process of a semiconductor device consistent with disclosed embodiments; and FIGS. 1-7 illustrate exemplary semiconductor structures corresponding to various stages of the fabrication process.

Figure 1:
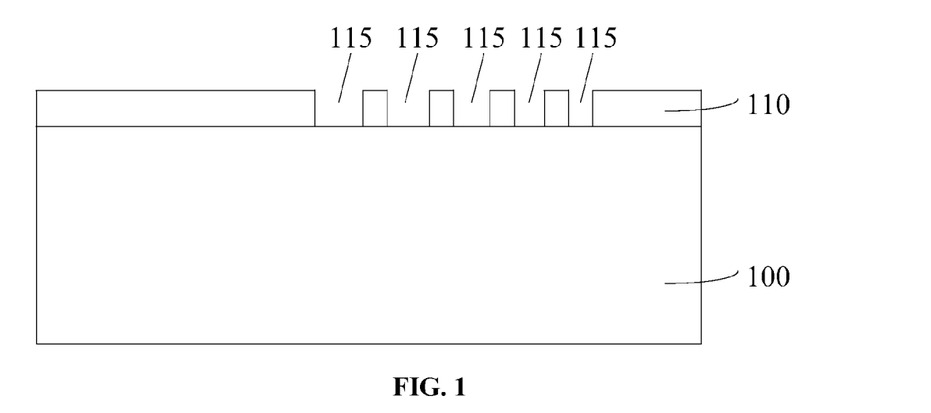
FIGS. 1-7 illustrate semiconductor structures corresponding to certain stages of an exemplary fabrication process of a semiconductor device.

As shown in FIG. 8, at the beginning of the fabrication process, a semiconductor substrate with certain structures is provided (S101). FIG. 1 illustrates a corresponding semiconductor structure.

As shown in FIG. 1, a semiconductor substrate 100 is provided. The semiconductor substrate 100 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, or ally semiconductor, etc. In one embodiment, the semiconductor substrate 100 is silicon. The semiconductor substrate 100 may be in situ doped with P-type or N-type ions during a process for forming the semiconductor substrate 100. The semiconductor substrate 100 provides a base for subsequent structures and processes.

In certain other embodiments, a P-type well region or an N-type well region may be formed in the semiconductor substrate 100 by a P-type ion implantation process or an N-type ion implantation process. A P-type epitaxial layer or an N-type epitaxial layer may also be formed on the semiconductor substrate 100 by a P-type ion implantation process or an N-type ion implantation process. A depth of the well region or a thickness of the epitaxial layer may be greater than a depth of a subsequently formed body region and/or a depth of a subsequently formed drift region.

In one embodiment, the semiconductor device is an N-type LDMOSFET, doping types of a subsequently formed source region, a subsequently formed drain region and a subsequently formed drift region may all be N-type; and the semiconductor substrate 100, a subsequently formed body region and a subsequently formed bulk region (connection region of the body region) may all be P-type doped.

In certain other embodiments, the semiconductor device is a P-type LDMOSFET, doping types of a subsequently formed source region, a subsequently formed drain region and a subsequently formed drift region may all be P-type; and the semiconductor substrate 100, a subsequently formed body region and a subsequently formed bulk region (may refer to a connection region of the body region) may all be N-type doped.

In certain other embodiments, the semiconductor device is a PNPN-type LIGBT, doping types of a subsequently formed source region and a subsequently formed drift region may all be N-type; and the semiconductor substrate 100, a subsequently formed body region, a subsequently formed bulk region and a subsequently formed drain region may all be P-type doped.

Referring to FIG. 1, after providing the semiconductor substrate 100, a mask layer 110 may be formed on the semiconductor substrate 100. The mask layer 110 may have a plurality of parallel openings 115. Positions of the openings 115 may correspond to a position of the subsequently formed drift region. In one embodiment, widths of the adjacent openings 115 may be different. In certain other embodiments, the widths of the adjacent openings 115 may be same.

The mask layer 110 may be made of any appropriate material, such as a photoresist layer, or a hard mask layer made of silicon oxide, silicon nitride, or silicon oxynitride, etc. In one embodiment, the mask layer 110 is a photoresist layer. In certain other embodiments, the hard mask layer 110 may be a multiple-layer structure including a hard mask layer formed on the semiconductor substrate 100 and a photoresist layer formed on the hard mask layer.

The plurality of openings 115 may correspond to a plurality of subsequently formed trenches; and may all be within the subsequently formed drift region. Lengths of the opening 115 may be same; and the widths of the adjacent openings 115 may be different. In one embodiment, the widths of different openings 115 may gradually decrease along a direction from the subsequently formed body region to the subsequently formed drift region. Further, width differences of the adjacent openings 115 may be equal, thus width differences of subsequently formed parallel trenches may also be equal.

In certain other embodiments, the width differences of the adjacent openings 115 may be different; and the widths of different openings 115 may gradually increase along the direction from the subsequently formed body region to the subsequently formed drift region.

In certain other embodiments, the widths of adjacent openings 115 may be different, the widths of different openings 115 may gradually increase along the direction from the subsequently formed body region to the subsequently formed drift region firstly; then decrease along the direction from the subsequently formed body region to the subsequently formed drift region. Alternatively, the widths of different openings 115 may gradually decrease along the direction from the subsequently formed body region to the subsequently formed drift region firstly; then increase along the direction from the subsequently formed body region to the subsequently formed drift region. The widths of the different openings 115 may be designed according to a device simulation of the doping concentration of the subsequently formed drift region.

In one embodiment, distances between adjacent openings 115 may be equal. The distance may be the minimum critical dimension of a current process, thus distances of adjacent subsequently formed trenches may also be equal; and may be equal to the minimum critical dimension of the current process. In certain other embodiments, the distances between adjacent openings 115 may be different; and the distances between adjacent openings 115 may be greater than the critical dimension of the current process.

The number of the openings 115 may be greater than two. More numbers of the openings may cause a subsequently formed first shallow trench isolation (STI) structure to have more numbers of ladder steps, thus more numbers of corners corresponding the ladder steps may be formed. Therefore, an electric field finally applied between the subsequently formed drift region and the substrate 100 near to the subsequently formed body region may be weaker.

In one embodiment, the subsequently formed first STI structure and other STI structures in other regions of the semiconductor substrate 100 may be formed by different processes. In certain other embodiments, the subsequently formed first STI structure and the other STI structures in other regions of the semiconductor substrate 100 may be formed simultaneously. That is, the mask layer 110 may have other openings; and the other openings may be used to form the other STI structures in the other regions of the semiconductor substrate 100.

Figure 2:
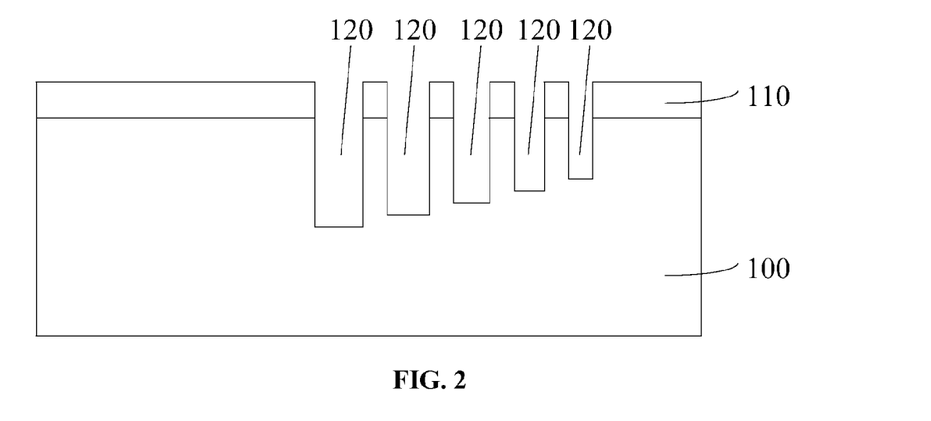

Returning to FIG. 8, after providing the semiconductor substrate 100 with the mask layer 110 having the plurality of openings 115, a plurality of trenches may be formed in the semiconductor substrate 100 (S102). FIG. 2 illustrates a corresponding semiconductor structure.

As shown in FIG. 2, a plurality of parallel trenches 120 are formed in the semiconductor substrate 100; and depths of the trenches 120 may decrease along the direction from the subsequently formed body region to the subsequently formed drift region.

The trenches 120 may be formed by etching the semiconductor substrate 100 using the mask 110 having the openings 115 as an etching mask. Various etching processes may be used to etch the semiconductor substrate 100 to form the trenches 120, such as a dry etching process, a wet etching process, or an ion beam etching process, etc. In one embodiment, a dry etching process may be used to etch the semiconductor substrate 100 to form the trenches 120.

The dry etching process may include a reactive ion etching process or a charge-coupled plasma etching process, etc. Because the reactive ion etching process or the charge-couples plasma etching process may have a loading effect. That is, when size of etching openings of a to-be-etched material are different, a larger opening may expose to more etching gas than an a smaller opening, thus an etching rate corresponding to the larger opening may be greater than an etching rate corresponding to a smaller opening. Therefore, a depth of a trench corresponding to the larger opening may be greater than a depth of the trench corresponding to the smaller opening after being etched by a same amount of etching time.

In one embodiment, because the widths of the different openings 115 may gradually decrease along the direction from the subsequently formed body region to the subsequently formed drift region, depths of the trenches 120 may gradually decrease along the direction from the subsequently formed body region to the subsequently formed drift region. That is, referring to FIG. 2, the trench 120 near to a subsequently formed P-type source region may have the largest depth; and the trench 120 near to a subsequently formed N-type drain region may have the smallest depth.

In certain other embodiments, if the widths of the different openings 115 gradually increase along the direction from the subsequently formed body region to the subsequently formed drift region, the depths of the trenches 120 may gradually increases along the direction from the subsequently formed body region to the subsequently formed drift region.

In certain other embodiments, if the widths of the different openings 115 gradually increase along the direction from the subsequently formed body region to the subsequently formed drift region firstly; then the widths of the different openings 115 gradually decrease along the direction from the subsequently formed body region to the subsequently formed drift region, the depths of the trenches 120 may gradually increase firstly; and then gradually decrease. Similarly, if the widths of the different openings 115 gradually decrease along the direction from the subsequently formed body region to the subsequently formed drift region firstly; then the widths of the different openings 115 gradually increase along the direction from the subsequently formed body region to the subsequently formed drift region, the depths of the trenches 120 may gradually decrease firstly, then gradually increase. Therefore, depth differences of the trenches 120 may be controlled by the width differences of the opening 115.

The plurality of the trenches 120 with different depths may be formed by one single etching process, thus a fabrication process of a subsequently formed STI structure with a ladder-like bottom may be relatively simple; and the production cost may be relative low.

Figure 3:
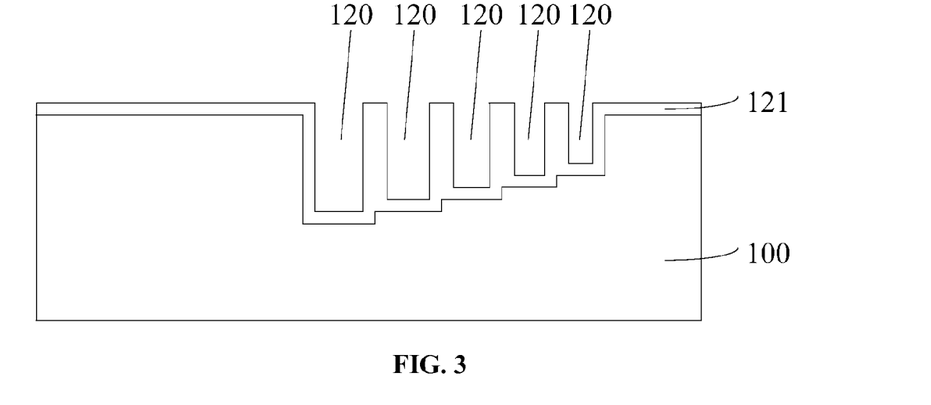

Returning to FIG. 8, after forming the trenches 120, the mask layer 120 may be removed; and a first oxide layer may be formed (S103). FIG. 3 illustrates a corresponding semiconductor structure.

As shown in FIG. 3, the mask layer 110 is removed; and the first oxide layer 121 is formed. The first oxide layer 121 may be formed by completely oxidizing the semiconductor substrate 100 between adjacent trenches 120. A top surface of the semiconductor substrate 100 may also be oxidized to form a portion of the first oxide layer 121. In certain other embodiments, the semiconductor substrate 100 between adjacent trenches 120 may be partially oxidized to form the first oxide layer 121.

Various processes may be used to remove the mask layer 110, such as a dry etching process including a plasma etching process, or a plasma ashing process, etc.

Various processes may be used to oxidize the semiconductor substrate 100 to form the first oxide layer 121, such as thermal oxidation process, a plasma oxidation process, or a chemical oxidation process, etc. In one embodiment, the first oxide layer 121 is formed by a thermal oxidation process. The surface of the semiconductor substrate 100 and side surfaces and bottom surfaces of the trenches 120 may be oxidized by a thermal oxidation process; and the first oxide layer 121 may be formed. A thickness of the first oxide layer 121 on the semiconductor substrate 100 may be equal to, or greater than one-half of a width of the semiconductor substrate 100 between adjacent trenches 120, thus the semiconductor substrate 100 between adjacent trenches 120 may be completely oxidized. After subsequently filling up the trenches 120 with a dielectric material, the bottom of a subsequently formed STI structure may have a ladder-like bottom.

In certain other embodiments, the mask layer 110 may be removed after forming the first oxide layer 121. Thus, the first oxide layer 121 may only be formed on the side surfaces and the bottom surfaces of the trenches 120.

Figure 4:
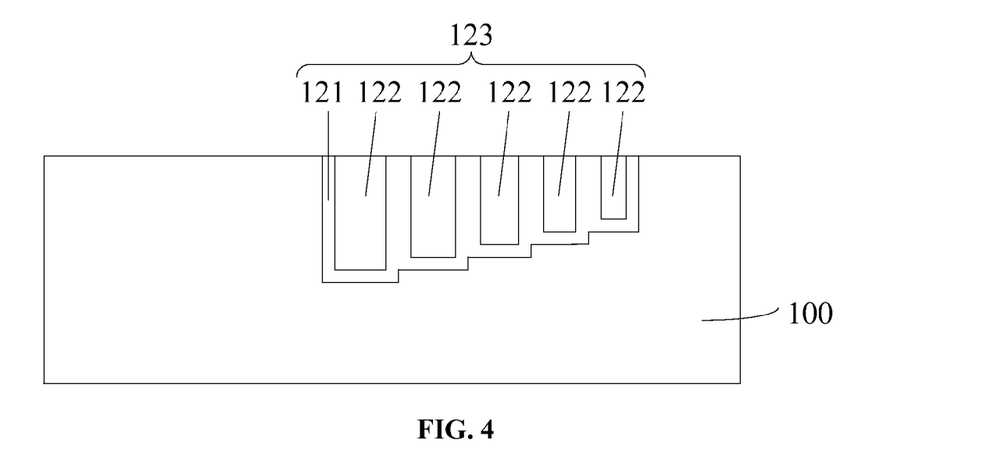

Returning to FIG. 8, after forming the first oxide layer 121, a first shallow trench isolation (STI) structure may be formed (S104). FIG. 4 illustrates a corresponding semiconductor structure.

As shown in FIG. 4, a first STI structure 123 is formed. The first STI structure 123 may be formed by filling up the trenches 120 with dielectric material 122; and the dielectric material 122 and the first oxide layer 121 together may form the first STI structure 123. Further, the first STI structure 123 may have a ladder-like bottom. The ladder-like bottom of the first STI structure 123 may cause the thickness of a subsequently formed drift region to be gradually changed. Steps of the ladder-like bottom may correspond to the number of the trenches 120.

Various processes may be used to fill the dielectric material 122 into the trenches 120, such as a chemical vapor deposition (CVD) process, a physical vapor deposition (PVD) process, a flowable CVD (FCVD) process, or an atomic layer deposition (ALD) process, etc. The CVD process may include a high-density plasma CVD (HDPCVD) process, a low-pressure CVD (LPCVD) process or a plasma enhanced CVD (PECVD) process, etc. In one embodiment, a HDPCVD process is used to fill up the trenches 120 with the dielectric material 122.

The dielectric material 122 may include any appropriate material, such as silicon oxide, silicon nitride, or silicon oxynitride, etc. In one embodiment, the dielectric material 122 is silicon oxide. In certain other embodiments, the dielectric material 122 may be a stacked structure including silicon oxide and silicon nitride.

A process for filling up the trenches 120 with the dielectric material 122 may include depositing a dielectric material layer (not shown) in the trenches 120 to fill up the trenches 120 by the HDPCVD process; and the dielectric material 122 may also be deposited on the surface of the semiconductor substrate 100. Then, a chemical mechanical polishing (CMP) process may be performed to remove the dielectric material layer 122 on the surface of the semiconductor substrate 100 until the surface of the semiconductor substrate 100 is exposed. Thus, the dielectric material in the trenches 120 and the first oxide layer 121 connecting with the dielectric material 122 may together form the first STI structure 123 having a ladder-like bottom.

Figure 5:
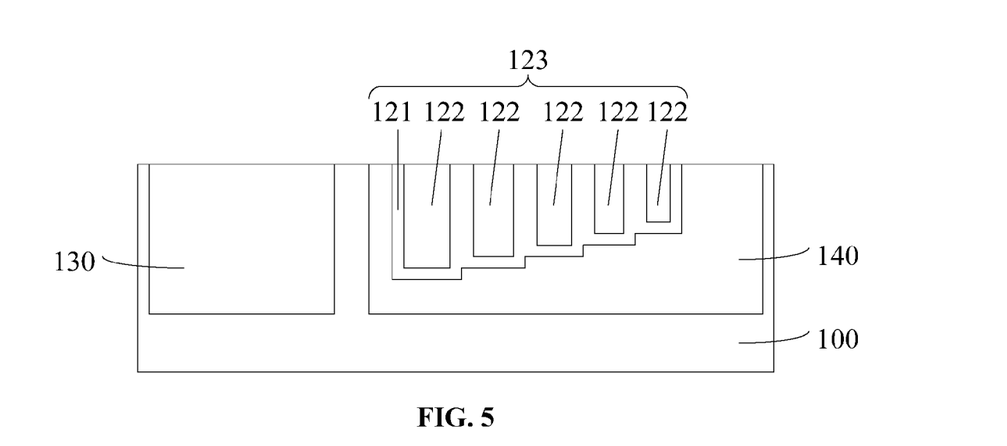

Returning to FIG. 8, after forming the first STI structure 123, a body region and a drift region may be formed in the semiconductor substrate 100 (S105). FIG. 5 illustrates a corresponding semiconductor structure.

A shown in FIG. 5, a body region 130 and a drift region 140 are formed in the semiconductor substrate 100. In one embodiment, the semiconductor device may be an N-type LDMOSFET; the body region 130 may be a P-type body region; and the drift region 140 may be an N-type drift region.

The N-type drift region 140 may correspond to the first STI structure 123; and the first STI structure 123 may be completely in the N-type drift region 140.

Various processes may be used to form the N-type drift region 140, such as an ion implantation process, or a diffusion process, etc. In one embodiment, the N-type drift region 140 is formed by an ion implantation process. N-type ions for forming the N-type drift region 140 by the ion implantation process may include phosphor ions, arsenic ions or antimony ions, etc.

Increasing a doping concentration of the N-type drift region 140 may increase the on-current of the LDMOSFET, but it may decrease the breakdown voltage between the N-type drifting region 140 and the semiconductor substrate 100 near to the P-type body region 130. When the first STI structure 123 with the ladder-like bottom is formed in the N-type doping region 140, the ladder-like bottom may have a plurality of corners, peak values of lateral electric fields in the drift region and the channel region of the LDMOSFET may be generated at the corners. More numbers of the steps of the ladder-like bottom may generate more numbers of peak values of the electric field. That is, comparing with an STI structure with a flat bottom, which may only have two peak values, the electric field in the drift region and the channel region of the LDMOSFET with the first STI structure 123 having the ladder-like bottom may have more than two peak values. Thus, a static discharge voltage may be divided at the corners; and electric fields between the drift region 140 and the body region 130 and/or the semiconductor substrate near to the body region 130 may be reduced.

Therefore, although the breakdown voltage of the LDMOSFET may be reduced in order to increase the on-current, the electric field between the drift region 140 and the body region 130 and/or the semiconductor substrate near to the body region 130 may also be reduced by forming the first STI structure having the ladder-like bottom; the breakdown voltage may still match requirements of the LDMOSFET. In other words, a voltage withstanding ability of the semiconductor device may not be reduced when the on-resistance is reduced and the on-current is increased by using a high concentration doping in the drift region.

In addition to the ladder-like or multiple-step bottom structure, other bottom structure with regular and uneven structures may also be included, such that the voltage withstanding ability of the semiconductor device might not be reduced when the on-resistance is reduced and the on-current is increased by using a high concentration doping in the drift region. Examples of the regular and uneven structures may include a series curve surfaces, a tilted surface or a series of tilted surfaces, or other suitable unevenly arranged structures.

Referring to FIG. 5, the P-type body region 130 may close to one side of the drift region 140 having the deepest step of the first STI structure 123. In one embodiment, the P-type body region 130 may contact with the N-type drift region 140. In certain other embodiments, the P-type body region 130 may not contact with the N-type drift region 140. That is, the P-type body region 130 and the N-type drift region 140 may be isolated by a portion of the semiconductor substrate 100 with pre-determined widths.

Various processes may be used to form the P-type body region 130, such as an ion implantation process, or a diffusion process, etc. In one embodiment, the N-type body region 130 is formed by an ion implantation process. P-type ions for forming the P-type body region 130 by the ion implantation process may include boron ions, gallium ions or indium ions, etc. In one embodiment, a doping concentration of the P-type body region 130 may be greater than a doping concentration of the P-type semiconductor substrate 100.

In one embodiment, the first STI structure 123 is formed firstly; and then the P-type body region 130 and the N-type drift region 140 may be formed. Such a sequence may prevent a distribution of the doping ions of the N-type drift region 140 from being affected by the processes for forming the first STI structure 123. Thus, the effect to the on-current of the LDMOSFET may be prevented. In certain other embodiments, the P-type body region 130 and the N-type drift region 140 may be formed firstly; and then the first STI structure 123 may be formed in the N-type drift region 140.

In certain other embodiments, when the semiconductor structure is a P-type LDMOSFET, the body region 130 may be an N-type body region; and the drift region 140 may be a P-type drift region.

In certain other embodiments, when the semiconductor structure is a PNPN-type LIGBT, the body region 130 may be a P-type body region; and the drift region 140 may be an N-type drift region.

Returning to FIG. 8, after forming the body region 130 and the drift region 140, a bulk region and a source region may be formed in the body region 130; and a drain region may be formed in the drift region 140 (S106). FIG. 6 illustrates a corresponding semiconductor structure.

As shown in FIG. 6, a bulk region 131 and a source region 132 may be formed in the body region 130. A drain region 141 may be formed in the drift region 140. The drain region 141 may be formed at one side of the first STI structure 123 away from the body region 130. The bulk region 131 may also be referred as a body region connection region.

In one embodiment, the semiconductor structure may be an N-type LDMOSFET, the bulk region 131 may be a P-type bulk region; the source region 132 may be an N-type source region; and the drain region 141 may be an N-type drain region.

Various processes may be used to form the source region 132 and/or the drain region 141, such as an ion implantation process, or a diffusion process, etc. In one embodiment, the source region 132 and the drain region 141 are formed by one ion implantation process. In certain other embodiments, the source region 132 and the drain region 141 may be formed by separated processes.

Depths of the source region 132 and the drain region 141 may be smaller than a depth of the body region 130 or a depth of the drift region 140. Further, in order to lower the on-resistance and increase the on-current, a doping concentration of the source region 132 and the drain region 141 may be greater than the doping concentration of the drift region 140.

A doping type of the bulk region 131 may be same as the doping type of the body region 130. A depth of the bulk region 131 may be smaller than the depth of the body region 130. Further, in order to decrease the on-resistance and increase the on-current of the LDMOSFET, a doping concentration of the bulk region 131 may be greater than the doping concentration of the body region 130.

In one embodiment, the source region 132 may be in between the bulk region 131 and the drift region 140; and the source region 132 and the drain region 141 may be configured as a source region and a drain region of the LDMOSFET.

In certain other embodiments, when the semiconductor device is a P-type LDMOSFET, the bulk region 131 may be an N-type bulk region; the source region 132 may be a P-type source region; and the drain region 141 may be a P-type drain region.

In certain other embodiments, when the semiconductor device is a PNPN-type LIGBT, the bulk region 131 may be a P-type bulk region; the source region 132 may be an N-type source region; and the drain region 141 may be a P-type drain region.

Returning to FIG. 8, after forming the bulk region 131, the source region 132 and the drain region 141, a gate structure may be formed on the surface of the semiconductor substrate 100 (S107). FIG. 7 illustrates a corresponding semiconductor structure.

As shown in FIG. 7, a gate structure 150 is formed on the surface of the semiconductor substrate 100. The gate structure 150 may span over an edge of the body region 130 and an edge of the drift region 140. Further, the gate structure 150 may cover a portion of the first STI structure 123.

The gate structure 150 may include a gate dielectric layer (not labeled) spanning over the edge of the body region 130 and the edge of the drift region 140 on the surface of the semiconductor substrate; a gate electrode layer (not labeled) on the gate dielectric layer; and sidewall spacers on side surfaces of the gate electrode layer and the gate dielectric layer.

The gate structure 150 may be a poly silicon gate structure or a metal gate structure. In one embodiment, the gate structure 150 is a poly silicon gate structure. The gate structure 150 may be formed by any appropriate process Thus, a semiconductor device may be formed by above disclosed methods and processes; and a corresponding semiconductor device is illustrated in FIG. 7. As shown in FIG. 7, the semiconductor device includes a semiconductor substrate 100. The semiconductor device also includes a drift region 140 and a body region 130 formed in the semiconductor substrate 100. Further, the semiconductor device includes a bulk region 131 and a source region 123 formed in the body region 130. Further, the semiconductor device also includes a shallow trench isolation (STI) structure 123 having a ladder-like bottom and a drain region 141 formed in the drift region 140. Further, the semiconductor structure also includes a gate structure spanning over an edge of the body region 130 and an edge of the drift region 140 and covering a portion of the STI structure 123.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:
providing a semiconductor substrate;
forming a plurality of trenches with different depths in the semiconductor substrate;
forming a first oxide layer by oxidizing the semiconductor substrate between adjacent trenches;
forming a first shallow trench isolation structure by filling the trenches with different depths with dielectric material;
forming a body region and a drift region, wherein the first shallow trench isolation structure is in the drift region;
forming a bulk region and a source region in the body region and a drain region in the drift region at one side of the first shallow trench isolation structure away from the body region; and
forming a gate structure spanning over an edge of the body region and an edge of the drift region and covering a portion of the first shallow trench isolation structure on the semiconductor substrate.

2. The method according claim 1, wherein: the shallow trench isolation structure has a ladder-like bottom.

3. The method according claim 1, wherein forming the plurality of trenches further includes:
forming a mask layer having a plurality of openings with different widths on the semiconductor substrate; and
etching the semiconductor substrate using the mask layer as an etching mask.

4. The method according claim 1, wherein when the semiconductor device is a lateral double diffused MOS transistor:
doping types of the source region, the drain region and the drift region are same;
doping types of the body region and the bulk region are same; and
the doping type of the source region, the drain region and the drift region is opposite to the doping type of the body region and the bulk region.

5. The method according to claim 1, wherein when the semiconductor device is a lateral insulated gate bipolar transistor:
doping types of the source region and the drift region are same;
doping types of the body region, the bulk region and the drain region are same; and
the doping type of the source region and the drift region is opposite to the doping type of the body region, the bulk region and the drain region.

6. The method according claim 1, wherein:
distances between adjacent trenches are same.

7. The method according to claim 6, wherein:
a distance between adjacent trenches is equal to the minimum critical dimension of a current process.

8. The method according to claim 1, wherein:
the trenches are formed by a reactive ion plasma etching process or a charge coupled plasma etching process.

9. The method according to claim 1, wherein:
the first oxide layer is formed by a thermal oxidation process; and
a thickness of the first oxide layer is equal to, or greater than one half of a width of the semiconductor substrate between adjacent trenches.

10. The method according to claim 1, wherein:
the dielectric material is filled into the trenches by a high density plasma chemical vapor deposition process, a low pressure chemical vapor deposition process, or a plasma enhanced chemical vapor deposition process.

11. The method according to claim 1, wherein:
the first shallow trench isolation structure is formed by a same process for forming other shallow trench structures in other regions of the semiconductor substrate.

12. The method according to claim 1, wherein:
a total step numbers of the ladder-like bottom is greater than two.

13. The method according to claim 1, wherein forming the first shallow trench isolation structure further includes:
   forming a dielectric material layer on the semiconductor substrate and filling up the trenches; and
   removing the dielectric material on the surface of the semiconductor substrate until the surface of the semiconductor substrate is exposed.

14. A semiconductor device, comprising:
   a semiconductor substrate;
   a body region and a drift region formed in the semiconductor substrate;
   a bulk region and a source region formed in the body region;
   a drain region and a first shallow trench isolation structure having a ladder-like bottom formed in the drift region; and
   a gate structure spanning over an edge of the body region and an edge of the drift region and covering a portion of the first shallow trench isolation structure formed on the semiconductor substrate,
   wherein the first shallow trench isolation structure having the ladder-like bottom is formed by:
      forming a plurality of trenches having different depths in the semiconductor substrate;
      forming a first oxide layer by oxidizing the semiconductor substrate between adjacent trenches; and
      filling up the trenches with dielectric material.

15. The semiconductor substrate according to claim 14, wherein:
   depths of the trenches gradually decrease along a direction from the body region to the drift region; and
   widths of steps of the ladder-like bottom gradually decrease along a direction from the body region to the drift region.

16. The semiconductor device according to claim 14, wherein when the semiconductor device is a lateral double diffused MOS transistor:
   doping types of the source region, the drain region and the drift region are same;
   doping types of the body region and the bulk region are same; and
   the doping type of the source region, the drain region and the drift region is opposite to the doping type of the body region and the bulk region.

17. The semiconductor device according to claim 14, wherein when the semiconductor device is a lateral insulated gate bipolar transistor:
   doping types of the source region and the drift region are same;
   doping types of the body region, the bulk region and the drain region are same; and
   the doping type of the source region and the drift region is opposite to the doping type of the body region, the bulk region and the drain region.

18. The semiconductor device according to claim 14, wherein:
   widths of the trenches gradually decrease along a direction from the body region to the drift region.

19. The semiconductor device according to claim 14, wherein:
   a step number of the ladder-like bottom is greater than two.

20. The semiconductor device according to claim 14, wherein:
   the first shallow trench isolation structure having a ladder-like bottom is in between the body region and the drift region; and
   the drain region is at one side of the shallow trench isolation structure having a ladder-like bottom in the drift region away from the body region.

* * * * *